United States Patent [19]
Osterwalder et al.

[11] Patent Number: 5,280,382
[45] Date of Patent: Jan. 18, 1994

[54] DIRECT CURRENT TO RADIO FREQUENCY PULSE GENERATING SYSTEM

[75] Inventors: Johann M. Osterwalder, Encinitas; Trevor G. Hame, San Diego, both of Calif.

[73] Assignee: Hughes Missile Systems Company, Los Angeles, Calif.

[21] Appl. No.: 529,297

[22] Filed: May 25, 1990

[51] Int. Cl.$^5$ ............................................. H03K 5/00
[52] U.S. Cl. ........................................ 359/328; 328/65
[58] Field of Search ............... 307/425, 426, 427, 428, 307/429, 430, 641, 260, 284, 305, 639; 328/2, 63, 65; 323/902, 221, 223

[56] References Cited

U.S. PATENT DOCUMENTS

| | | | |
|---|---|---|---|
| 3,524,986 | 8/1970 | Hamden, Jr. | 307/284 |
| 3,772,613 | 11/1973 | Smith | 328/65 X |
| 3,881,120 | 4/1975 | Osterwalder | 328/65 X |
| 3,986,050 | 10/1976 | Beckman | 307/641 |
| 4,099,128 | 7/1978 | Hooper | 328/65 |
| 4,176,295 | 11/1979 | Driver et al. | 328/65 X |

Primary Examiner—Tod R. Swann
Attorney, Agent, or Firm—Randall M. Heald; Charles D. Brown; Wanda K. Denson-Low

[57] ABSTRACT

A circuit arrangement to convert high voltage direct current energy into radio frequency energy that includes photoconductive switch means which is periodically closed by a pulsed light source, such as a laser, to generate the radio frequency energy. A segmented transmission line which includes a plurality of photoconductive switches positioned a half-wavelength apart that are closed simultaneously by the laser may be used to generate the radio frequency energy. The photoconductive switches may also be connected in parallel and closed by time delayed light pulses to generate the radio frequency energy. The pulses generated may also be used to excite a resonator circuit coupled to a load to increase the duration of the high frequency oscillation and to shape (filter) the resultant waveform. Other configurations utilizing photoconductive semiconductor discs and annular metal electrode configurations which may be closed by light pulses are also illustrated.

19 Claims, 4 Drawing Sheets

DIRECT CURRENT TO RADIO FREQUENCY PULSE GENERATING SYSTEM

FIELD OF THE INVENTION

This invention relates to an improvement in the field of conversion of high voltage direct current energy to radio frequency energy and more particularly, but not by way of limitation, to a circuit arrangement which utilizes photoconductive switch means coupled to a high voltage direct current energy source and selectively closed by a pulsed light source to form a radio frequency waveform which may be applied to a load.

In the field of conversion of direct current high voltage energy to radio frequency energy, a need has existed for a reliable system which performs such conversions without using an electron beam and the associated vacuum tube structures. Key objectives for a new improved system are an increased conversion efficiency, increased reliability and lower cost. It is believed that such objectives have been met by the present invention which has special application in space uses.

SUMMARY OF THE INVENTION

Briefly stated, the present invention contemplates a system to convert high voltage direct current energy into radio frequency energy which includes a source of high voltage direct current energy, a source of pulsed light, and a load. A photoconductive switch means is connected to the load and arranged to receive light pulses from the pulsed light source for periodic closure thereof so that pulses of electrical energy are applied to the load. One embodiment of the invention utilizes a plurality of photoconductive switches arranged in a serial configuration for closure by a pulsed laser. This embodiment is useful for short but very high peak power pulses. Another embodiment employs a plurality of photoconductive switches arranged in a parallel configuration for selective closure by a pulsed laser. Such a configuration is especially useful for applications with medium peak power but long duration pulse requirements.

The present system may advantageously make use of solar energy as the source of high voltage direct current energy. In addition, other embodiments of the invention employ a resonator circuit that is rung by pulses to generate a waveform in the millimeter wave region.

Other advantages and features of the present invention will become clear from the following detailed description of the preferred embodiment of the invention when read in conjunction with the drawings and appended claims.

DETAILED DESCRIPTION OF THE DRAWINGS

Figure 1:
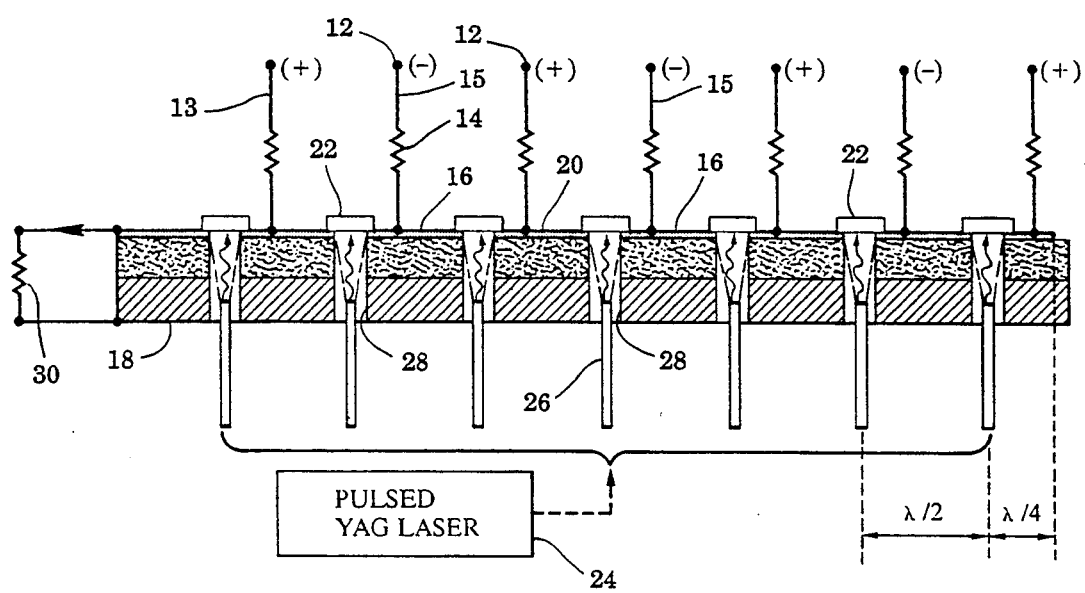
FIG. 1 is a simplified schematic of an electro-optically triggered radio frequency pulse generator constructed in accordance with the present invention and especially useful for generating short but very high peak power pulses.

Referring to the drawings in detail, and particularly FIG. 1, reference character 10 generally designates a electro-optically triggered pulse generator system for converting high voltage direct current energy to radio frequency energy that is constructed in accordance with the present invention. The system 10 includes a high voltage direct current supply 12 that is connected through a plurality of charging resistors 14 to a segmented transmission line 16. The direct current supply 12 is illustrated as having a plurality of positive direct current connections 13 that are alternated with a similar plurality of negative direct current connections 15. The segmented transmission line 16 may advantageously be made of copper and is separated from a suitable ground plate 18 by a suitable dielectric substrate 20. The resistors 14 cooperate with the segmented transmission line 16 and the ground plate 18 spaced from the segmented transmission line 16 by the dielectric substrate 20 to permit the build up of a capacitive voltage equal to the voltage of the supply 12 for selective discharge as will be described in greater detail hereinafter.

Interposed in the transmission line 16 are electro-optically triggered switch means to provided a complete current path through the transmission line 16. This electro-optically triggered switch means in the illustrated embodiment of the invention takes the form of a plurality of photoconductive switches 22 which are interposed in the transmission line 16 one-half wave-length apart.

A source of pulsed light, such as a pulsed YAG laser 24, provides through a suitable optic fiber feed 26 that is coupled to the photoconductive switches 22 through appropriate apertures 28 provided in the ground plate 18 and the dielectric substrate 20 a series of optic light pulses which simultaneously close all of the photoconductive switches at the same time. Once the photoconductive switches 22 have been illuminated by a pulse of light from the laser 24, they are closed simultaneously so that a discharge of electrical energy takes place along the transmission line 16 which results in two counter-propagating travelling waves along the transmission line 16. The resulting radio frequency can be extracted from either end, such as by load 30 connected to the transmission line 16 at one end thereof and to the ground plate 18, or at both ends of the transmission line 16. It should be noted that in the embodiment of the present invention illustrated in FIG. 1 the photoconductive switches 22 are connected serially and the closing of them by the pulses light source must take place simultaneously. This particular embodiment is particularly useful for applications which require short but very high peak power pulses.

Figures 2, 2A:
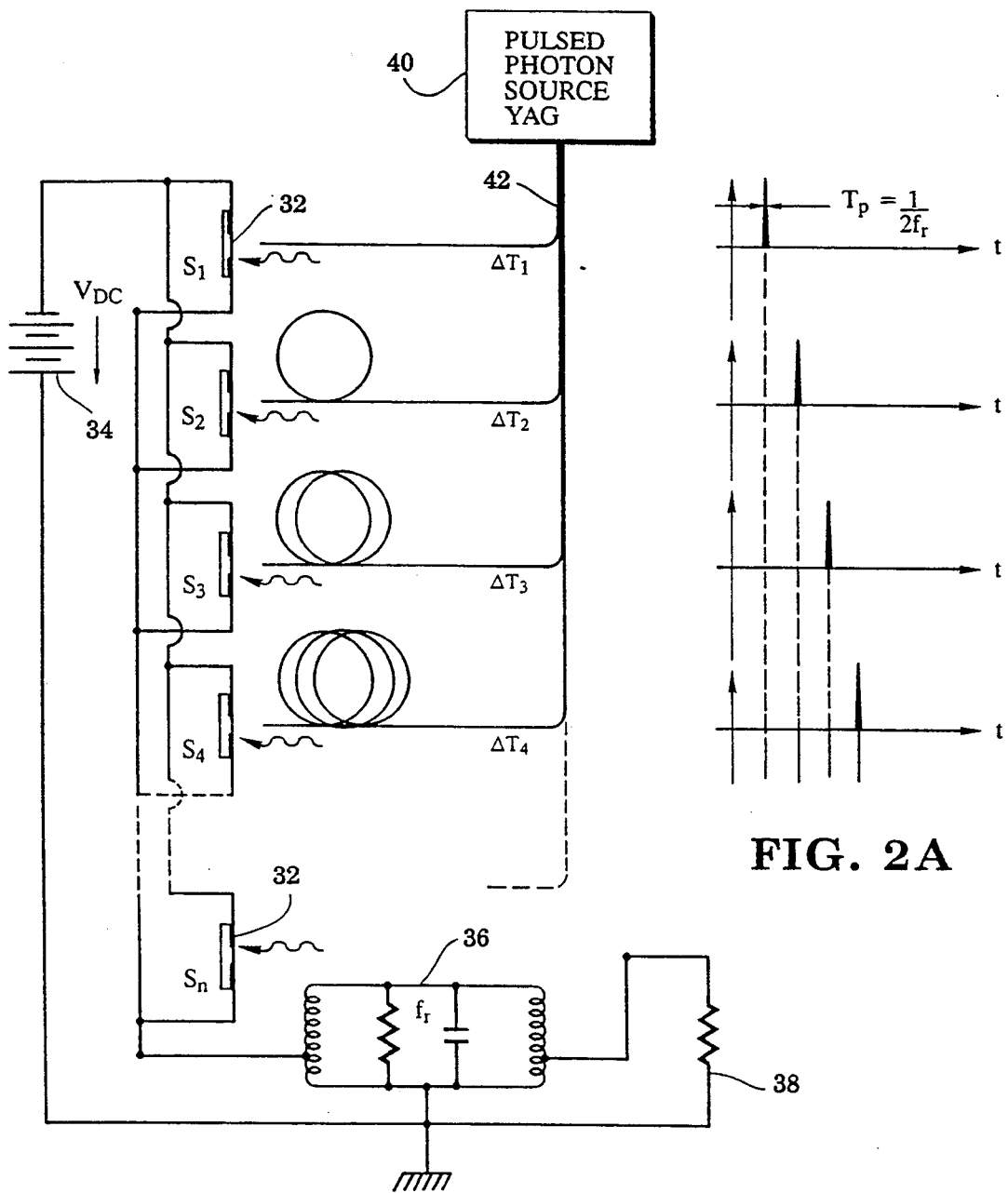
FIG. 2b is a simplified schematic of another embodiment of the electro-optically triggered radio frequency pulse generator that is suitable for applications with medium peak power but longer duration pulse requirements.

Referring now to FIG. 2, another embodiment of the invention will be illustrated. FIG. 2 shows a multi photoconductive switch configuration in which the switches are arranged in parallel to generate a radio frequency waveform. In FIG. 2 a plurality of photoconductive switches 32 are connected in parallel to a suitable high voltage direct current energy source 34. The photoconductive switches 32 are also connected to a suitable resonator circuit 36 having a predetermined resonant frequency and being connected to a suitable load 38.

As before, a pulsed light source, such as a pulsed YAG laser 40, is connected through a suitable optical fiber network 42 to the photoconductive switches 32. In this instance, each optical fiber branch 42 which couples the pulsed laser 40 to the photoconductive switches 32 has a predetermined length. Thus, the lengths of the branches of the optic fiber network 42 are chosen to introduce predetermined delays in the time it takes an optic light pulse emitted by the laser 40 to reach each photoconductive switch 32. Therefore, when a pulse is emitted by the pulse light laser 40 the pulse of optic light reaches each photoconductive switch 32 in a predetermined sequence as shown in the pulse diagram of FIG. 2A. As each pulse closes a photoconductive switch 32, a pulse of high voltage direct current energy is applied to the resonator circuit 36 to ring it at its resonant frequency. The resonator circuit 36 generates long radio frequency pulses or even continuous wave operation for application to the load 38. Thus, the embodiment of the invention shown in FIG. 2 is especially suitable for applications with medium peak power but long duration pulse requirements.

Figures 3, 3A:
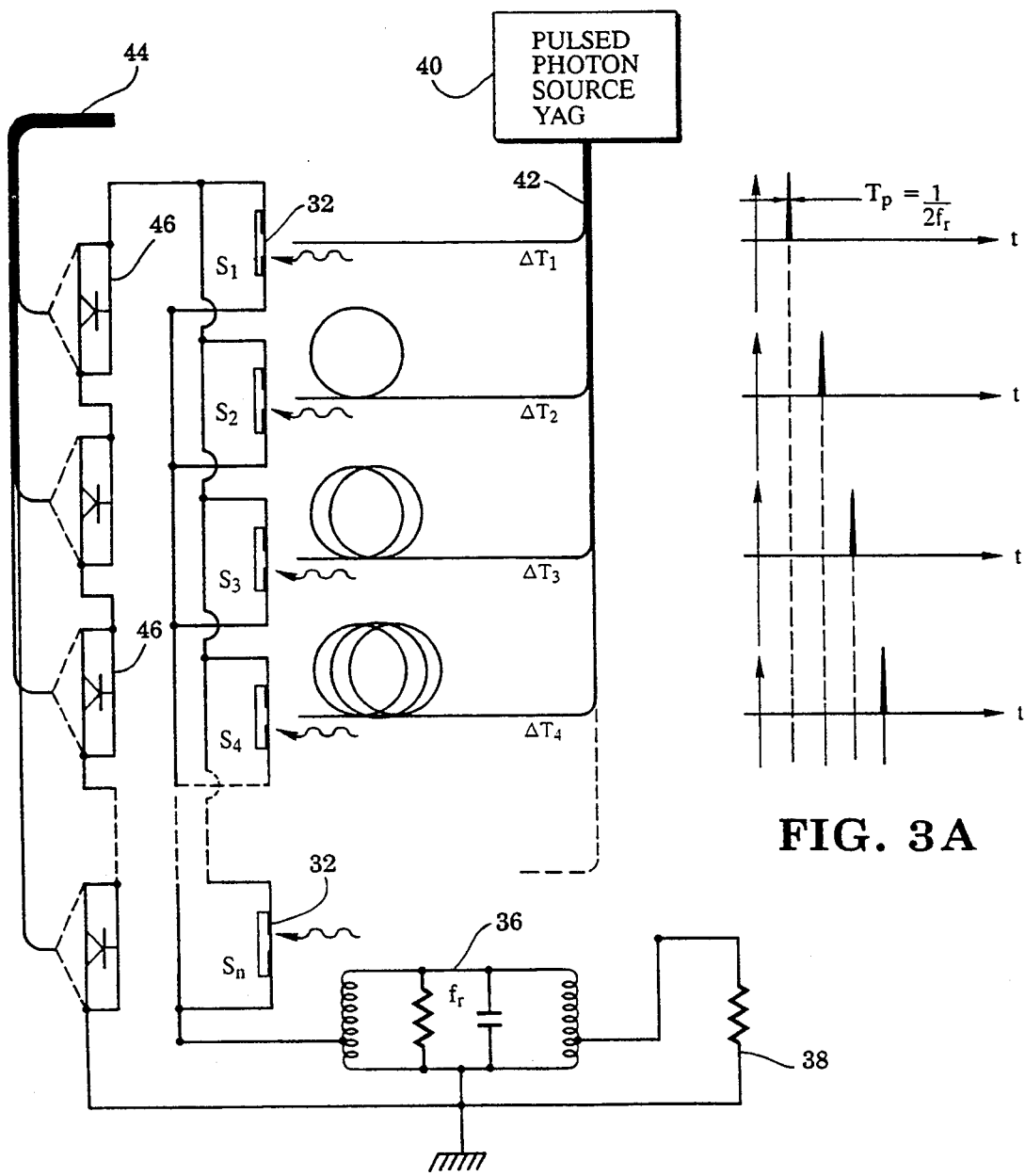
FIG. 3 is a simplified schematic of another embodiment of the present invention and illustrates an electro-optically triggered radio frequency pulse generator that is particularly adapted for space applications where it is desirable to convert solar energy into radio frequency energy.
FIG. 3A is a simplified pulse diagram illustrating the time delayed optical pulses to trigger the electro-optically excited radio frequency pulse generator.

The embodiment of the invention illustrated in FIG. 3 is especially suited for space applications where it is desirable to convert solar energy into radio frequency energy. In FIG. 3 the illustrated embodiment is similar in many respects to the embodiment shown in FIG. 2 with like characters designating like elements. In FIG. 3 the source of high voltage direct current energy is shown as being provided by solar energy which is collected by suitable Fresnel lenses, not shown, and directed through large core optical fibers 44 to a plurality of suitable solar concentrator cells 46 for conversion into direct current electrical energy. Each concentrator cell 46 is associated with a photoconductive switch 32 so that upon closure of a specific photoconductive switch by being illuminated by an optic pulse from the laser 40 a pulse of high voltage direct current is applied to the resonator circuit 36 to ring it at its resonant frequency. Again the embodiment of FIG. 3 provides an electro-optically triggered radio frequency pulse generator that is suitable for a space application with medium peak power but long duration pulse requirements.

Figure 4:
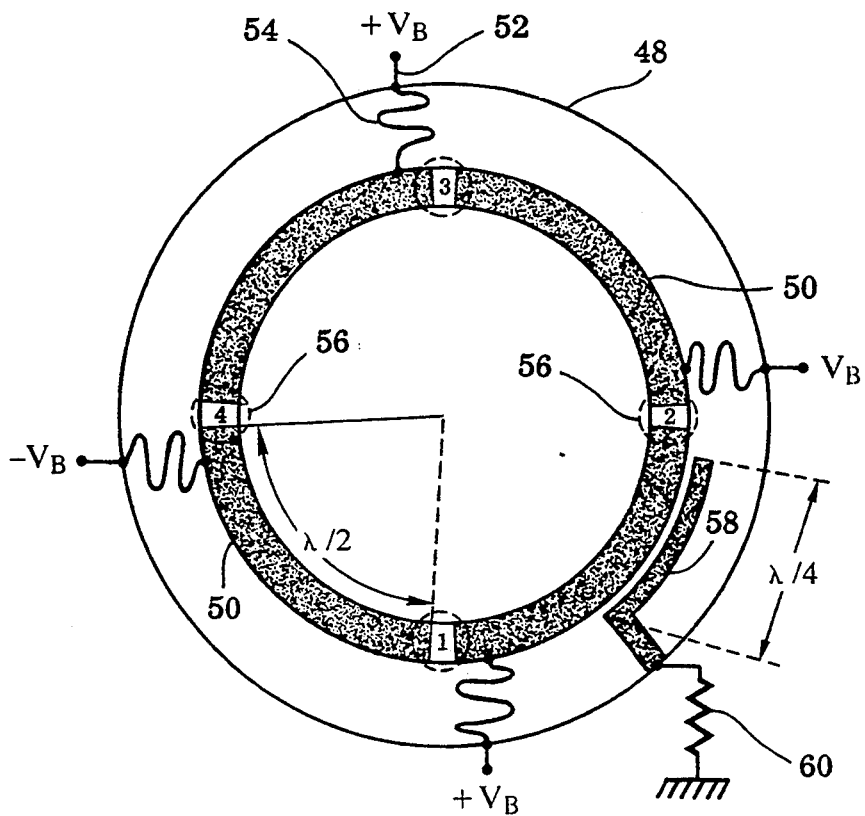
FIG. 4 is a simplified schematic of an embodiment of the electro-optically triggered radio frequency pulse generator of the instant invention that is adapted to use a semiconductor disc with metal electrodes.

Referring now to FIG. 4, an embodiment of the invention is illustrated which is capable of providing longer pulses and higher frequencies. In this embodiment a suitable photoconductive semiconductor disc 48 is provided on its upper surface with a plurality of curved electrodes 50 that are arranged into an annular configuration. A source of high voltage direct current 52 is connected to each annular electrode 50 through a suitable conductor 54 which for purposes of illustration may be considered to be copper etched onto the surface of the semiconductor disc 48. Between each pair of curved electrodes 50 is an electro-optically triggered means such as optical light pulses delivered by a optical fiber 56. Gaps in the metallisation are interposed between the curved electrodes 50 one-half wavelength apart on the top surface of the photoconductive semiconductor.

Thus, when the photoconductive switches 56 are simultaneously closed by a light source, such as a pulsed laser (not shown) two counterpropagating travelling waves are generated along the transmission line provided by the curved electrodes 50 being connected into a unitary transmission line by the photoconductive switches being closed. A suitable quarter-wave coupler 58 that is connected to the load 60 serves as a means to couple out the generated RF pulse. The embodiment of the invention shown in FIG. 4 is suitable for high frequency applications in the millimeter wave region.

Figure 5:
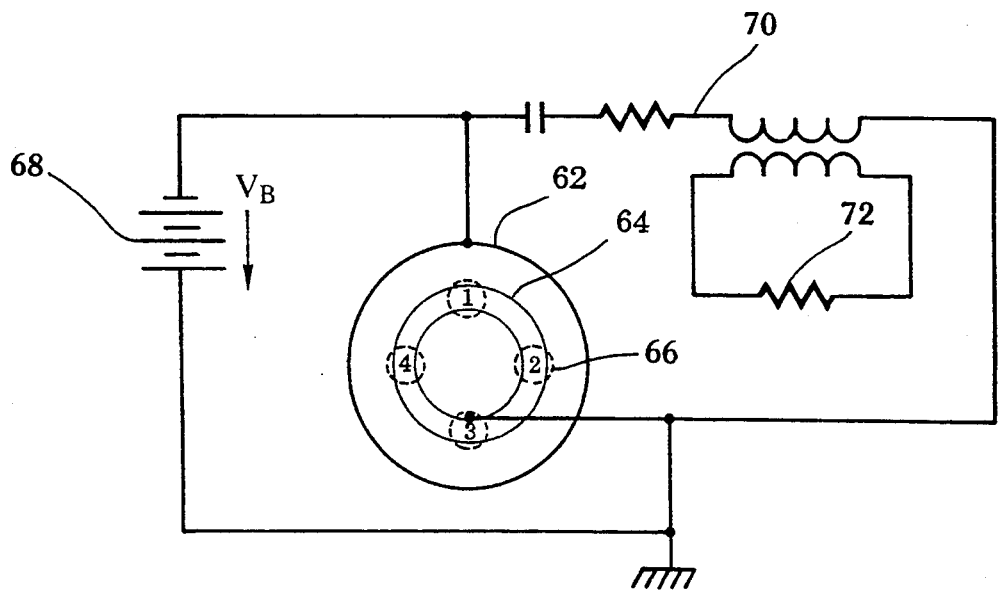
FIG. 5 is a schematic of an embodiment similar to that illustrated in FIG. 4 but which illustrates multi electro-optically triggered pulse generator that employs a plurality of integrated photoconductive switches arranged in a parallel ring configuration.

And yet another embodiment of the invention is seen in FIG. 5 where a photoconductive semiconductor disc 62 is provided on its upper portion with a plurality of curved electrodes 64 that are arranged preferably in an annular configuration. The curved electrodes 62 and 64 are spaced apart from one another to permit charging of the capacitor 69 which is part of the RF resonator cavity 70. The metal gaps 66 are adapted to be closed by sequential light pulses received from a pulsed light source, such as a pulsed YAG laser (not shown). A suitable high voltage direct current supply 68 is connected to the metallized photoconductive semiconductor disc 62 and to the circular electrode 64. The direct current supply 68 is also connected to a suitable resonator circuit 70 that is coupled to a load 72. Thus, when the gap in the annular electrode configuration is closed by pulses of optical light being applied sequentially at different locations along the gap, pulses of high voltage direct current are applied to the resonator circuit 70 to ring it at its resonant frequency and apply a radio frequency waveform to the load 72. If repetitive light pulses from a mode locked laser are applied to the photoconductive switches this embodiment of the invention can provide a continuous wave radio frequency output to the load.

Changes may be made in the combination and arrangement of parts or elements and implementation of the photoconductive material as heretofore set forth in the specification and shown in the drawings, it being understood that changes may be made in the precise embodiment shown without departing from the spirit and scope of the invention as defined in the following claims.

We claim:

1. A circuit to convert high voltage direct current energy into radio frequency energy which comprises:
 a source of high voltage direct current energy;
 a source of pulse light;
 a load, and
 a photoconductive material switch means connected to the load and arranged to receive light pulses from said pulsed light source for periodic closure thereof so that pulses of electrical energy are applied to the load
 said source of high voltage direct current energy includes a plurality of positive and negative high voltage direct current source;
 a segmented transmission line is connected to the load, and coupled to the plurality of positive and negative direct current sources, and
 the photoconductive material switch means includes a plurality of photoconductive switches interposed in the segmented transmission line a half-wavelength apart so that when they are closed simultaneously by the pulsed light source a positive and negative pulsed waveform is applied to the load.

2. The circuit of claim 1 wherein the plurality of positive and negative high voltage direct current sources is provided by positive and negative high voltage direct current sources being connected to the segmented transmission line through resistance which cooperate with a dielectric substrate separating a ground plate from the transmission line to provide a plurality of voltage sources adapted to be selectively coupled to the load.

3. The circuit of claim 2 wherein the source of pulsed light comprises a pulsed laser which is coupled to each photoconductive switch so that each pulse of light emitted by the laser closes all photoconductive switches simultaneously.

4. The circuit of claim 1 wherein a resonator circuit is connected to the load and to the photoconductive switch means so that pulses of high voltage direct current energy are coupled to the resonator circuit to generate a series of electrical energy pulses which are applied to the load.

5. The circuit of claim 4 wherein the photoconductive switch means comprises a plurality of photoconductive switches connected in parallel to the source of high voltage direct current energy.

6. The circuit of claim 1 wherein each photoconductive switch is coupled to the pulsed light source through a path having a predetermined length with the path lengths being varied so that the switches upon being closed by the pulsed light source provide a train of pulses of predetermined frequency to the resonator to thereby cause the resonator to generate a train of pulses having a longer duration of high frequency oscillations than that provided by the photoconductive switches.

7. The circuit of claim 6 wherein each photoconductive switch is coupled to the pulsed light source through an optical fiber means having a predetermined length, the lengths of the optical fibers being chosen to introduce predetermined time delays in the length of time taken by a pulse of light emitted by the pulsed light source to reach each photoconductive switch.

8. The circuit of claim 7 wherein the source of pulsed light comprises a pulsed laser coupled to the optical fiber means.

9. The circuit of claim 7 wherein the source of high voltage direct current energy is a direct current power supply.

10. The circuit of claim 5 wherein the source of high voltage direct current energy comprises a solar conversion means to convert a solar input into electrical energy.

11. The circuit of claim 10 wherein the solar conversion means comprises a plurality of serially connected solar concentrator cells which receive solar light through an optical fiber means.

12. The circuit of claim 1 wherein the segmented transmission line includes a plurality of curved metallic electrodes arranged in an annular configuration with gaps on the top surface of a photoconductive material so that when the gaps are closed simultaneously by the pulsed light source to form a transmission line a pulse waveform having a predetermined period is generated.

13. The circuit of claim 12 wherein a quarter-wave coupler electrically couples the annular segmented transmission line to the load.

14. The circuit of claim 13 wherein the annular transmission line is positioned on a photoconductive semiconductor disc and each curved metallic electrode is connected to a high voltage direct current source.

15. The circuit of claim 14 wherein each high voltage direct current source is connected to a curved metallic electrode through a metallic lead etched onto the surface of the semiconductor disc.

16. The circuit of claim 1 which further includes an annular metal electrode having at least one opening therein which may be selectively closed by the photoconductive switch means and which is connected to the load.

17. The circuit of claim 16 which further includes a photoconductive semiconductor disc upon which is positioned the annular metal electrode, the source of high voltage direct current energy being coupled to the semiconductor disc.

18. The circuit of claim 17 which further includes a resonator circuit which couples the load to the photoconductive semiconductor disc and the annular electrode so that, upon the photoconductive switch means being closed by a pulse of light from the pulsed light source, the resonator is excited to generate a series of high voltage energy pulses that are applied to the load.

19. The circuit of claim 18 wherein the photoconductive switch means comprises a plurality of photoconductive switches that are closed by sequential light pulses that are emitted by the pulsed light source to repeatedly excite the resonator to provide a series of high voltage direct current pulses that form a serial stream of pulses of radio frequency energy.

* * * * *